US006444586B2

(12) United States Patent
Ko

(10) Patent No.: US 6,444,586 B2
(45) Date of Patent: *Sep. 3, 2002

(54) METHOD OF ETCHING DOPED SILICON DIOXIDE WITH SELECTIVITY TO UNDOPED SILICON DIOXIDE WITH A HIGH DENSITY PLASMA ETCHER

(75) Inventor: Kei-Yu Ko, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/932,601

(22) Filed: Aug. 17, 2001

Related U.S. Application Data

(63) Continuation of application No. 09/121,732, filed on Jul. 23, 1998, now Pat. No. 6,277,758.

(51) Int. Cl.$^7$ ............................................. H01L 21/302
(52) U.S. Cl. ....................... 438/706; 438/719; 438/723; 438/729; 438/743
(58) Field of Search ................................ 438/706, 719, 438/723, 729, 743, 717, 721

(56) References Cited

U.S. PATENT DOCUMENTS

| | | | |
|---|---|---|---|
| 4,381,201 A | 4/1983 | Sakurai | |
| 4,472,729 A | 9/1984 | Shibata et al. | |
| 4,489,478 A | 12/1984 | Sakurai | |
| 4,681,657 A | 7/1987 | Hwang et al. | 156/657 |
| 4,753,709 A | 6/1988 | Welch et al. | 156/643 |
| 4,807,016 A | 2/1989 | Douglas | 357/67 |
| 4,818,335 A | 4/1989 | Karnett | 156/644 |
| 4,966,865 A | 10/1990 | Welch et al. | 437/192 |
| 5,037,777 A | 8/1991 | Mele et al. | 437/195 |
| 5,084,417 A | 1/1992 | Joshi | 437/192 |
| 5,150,276 A | 9/1992 | Gonzalez | 361/313 |

(List continued on next page.)

FOREIGN PATENT DOCUMENTS

| | | | |
|---|---|---|---|
| EP | 0265584 | 4/1988 | |
| EP | 0 465 044 A2 | 6/1991 | ................... 21/90 |
| EP | 0 496 614 A1 | 1/1992 | |
| EP | 0 763 850 A1 | 8/1996 | .................. 21/311 |
| JP | 56-114355 | 9/1981 | |
| JP | 60-042821 | 3/1985 | |
| JP | 61-133555 | 6/1986 | |
| JP | 4-345054 | 12/1992 | |
| JP | 4-360570 | 12/1992 | |
| JP | 5-335482 | 12/1993 | |

OTHER PUBLICATIONS

Van den Hoek, et al, "Vacuum, Surfaces, and Films", Journal of Vacuum Scientce & Technology A, Second Series vol. 7, No. 3, Part 1, May/Jun. 1989 pp. 670–675.

Ikegami, et al. "Mechanisms of High PSG/SiO2 Seletive Teching in a Highly Polymerized Fluorocarbon Plasma" Japanese Journal of Applied Physics, vol. 30, No. 7, Jul., 1991, pp. 1556–1561.

Primary Examiner—Benjamin L. Utech
Assistant Examiner—Binh X. Tran
(74) Attorney, Agent, or Firm—Workman, Nydegger & Seeley

(57) ABSTRACT

Disclosed is a process for removing doped silicon dioxide from a structure selectively to undoped silicon dioxide. A structure having both doped and undoped silicon dioxide regions is exposed to a high density plasma etch having a fluorinated etch chemistry. Doped silicon dioxide is preferably removed thereby at a rate 10 times or more greater than that of undoped silicon dioxide. The etch is conducted in a chamber having an upper electrode to which a source power is applied and a lower electrode to which a bias power is applied sufficient to generate a power density on a surface of the structure such that the source power density is in a range less than or equal to about 1000 W per 200-mm diameter wafer surface. The high density plasma etch has an ion density not less that about $10^9$ ions/cm$^3$. A variety of structures are formed with the etch process, including self-aligned contacts to a semiconductor substrate.

57 Claims, 4 Drawing Sheets

U.S. PATENT DOCUMENTS

| | | | |
|---|---|---|---|
| 5,252,517 A | 10/1993 | Blalock | 437/195 |
| 5,286,344 A | 2/1994 | Blalock et al. | 156/657 |
| 5,321,286 A | 6/1994 | Koyama et al. | 257/315 |
| 5,323,047 A | 6/1994 | Nguyen | 257/384 |
| 5,362,666 A | 11/1994 | Dennison | 437/52 |
| 5,366,590 A * | 11/1994 | Kadomura | 438/723 |
| 5,374,332 A | 12/1994 | Koyama et al. | 156/643 |
| 5,401,681 A | 3/1995 | Dennison | 437/60 |
| 5,422,308 A | 6/1995 | Nicholls et al. | 437/192 |
| 5,423,945 A | 6/1995 | Marks et al. | 156/662.1 |
| 5,429,070 A | 7/1995 | Campbell et al. | 118/723 |
| 5,445,712 A | 8/1995 | Yanagida | 156/662 |
| 5,485,035 A | 1/1996 | Lin et al. | 257/637 |
| 5,611,888 A | 3/1997 | Bosch et al. | 156/643.1 |
| 5,626,716 A | 5/1997 | Bosch et al. | 438/723 |
| 5,643,819 A | 7/1997 | Tseng | 437/60 |
| 5,677,227 A | 10/1997 | Yang et al. | 437/60 |
| 5,685,951 A * | 11/1997 | Torek et al. | 438/396 |
| 5,700,731 A | 12/1997 | Lin et al. | 438/381 |
| 5,712,202 A | 1/1998 | Liaw et al. | 438/253 |
| 5,731,130 A | 3/1998 | Tseng | 430/316 |
| 5,736,455 A | 4/1998 | Iyer | 138/592 |
| 5,747,369 A | 5/1998 | Kantimahanti et al. | 438/241 |
| 5,792,689 A | 8/1998 | Yang et al. | 438/253 |
| 5,821,594 A | 10/1998 | Kasai | 257/410 |
| 5,851,896 A | 12/1998 | Summerfelt | 438/396 |
| 5,883,436 A | 3/1999 | Sadjadi et al. | 257/760 |
| 5,897,352 A | 4/1999 | Lin et al. | 438/255 |
| 5,918,120 A | 6/1999 | Huang | 438/239 |
| 5,936,272 A | 8/1999 | Lee | 257/306 |
| 5,986,229 A | 11/1999 | Nakamura | 257/296 |
| 5,990,507 A | 11/1999 | Mochizuki | 257/295 |
| 6,124,191 A | 9/2000 | Bohr | 438/595 |
| 6,242,759 B1 | 6/2001 | Yamazaki et al. | 257/69 |
| 6,271,542 B1 | 8/2001 | Emma et al. | 257/67 |
| 6,277,758 B1 * | 8/2001 | Ko | 438/706 |

* cited by examiner

METHOD OF ETCHING DOPED SILICON DIOXIDE WITH SELECTIVITY TO UNDOPED SILICON DIOXIDE WITH A HIGH DENSITY PLASMA ETCHER

CROSS-REFERENCE TO RELATED APPLICATIONS

This application is a continuation of U.S. patent application Ser. No. 09/121,732, filed Jul. 23, 1998, now U.S. Pat. No. 6,277,758 B1, which is incorporated herein by reference.

BACKGROUND OF THE INVENTION

1. The Field of the Invention

The present invention relates to removing doped silicon dioxide from a structure in a process that is selective to undoped silicon dioxide. More particularly, the present invention is directed to a method of using a high density plasma etcher such that doped silicon dioxide is removed from a structure at a material removal rate that is greater than that of undoped silicon dioxide.

2. The Relevant Technology

Modern integrated circuits are manufactured by an elaborate process in which a large number of electronic semiconductor devices are integrally formed on a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductive substrates described above. The term "doped silicon dioxide" refers to silicon dioxide having a dopant concentration greater than or equal to about 3% by weight. The term "undoped silicon dioxide" is defined as silicon dioxide having a dopant concentration less than about 3% by weight.

The semiconductor industry is attempting to increase the speed at which integrated circuits operate, to increase the density of devices on integrated circuits, and to reduce the price of integrated circuits. To accomplish this task, semiconductor devices, including capacitors, resistors, transistors, diodes, and the like, are continually being increased in number and decreased in dimension in a process known as miniaturization. In advanced manufacturing of integrated circuits, hundreds of thousands of these semiconductor devices are formed on a single semiconductor substrate. Efficient packing of these devices requires multilayer topographical design.

One common process for forming a topographical design on a semiconductor substrate involves etching of semiconductor material. The dimensional extent of material removal during an etch process is typically controlled by providing etch-resistant materials in predetermined regions of a semiconductor substrate. An etch-resistant structure that shields underlying material from an etch is known as an etch mask, while etch-resistant material positioned beneath material to be removed is an etch stop. In either case, the etch process is substantially selective to the etch stop or etch mask, while being not selective to the material to be removed.

In one common etching process, an etch-resistant masking layer is deposited and patterned over the semiconductor material to be etched. The pattern formed on the layer of masking material defines a series of openings in the masking material and corresponds to the topographical design to be formed during the etching process. Next, an etchant is applied to the semiconductor material through the pattern openings. A material, which may be doped silicon dioxide, is removed through the pattern openings, while the etch mask protects material positioned directly therebelow. Currently, photoresist material is commonly used as an etch mask. Use of photoresist material in an etch process involves forming, developing, and patterning the photoresist material, applying an etchant to etch the silicon dioxide, and then removing the photoresist material. The multiple steps involved in using photoresist material require time and resources that can increase the cost of producing integrated circuits.

In other applications, an etch-resistant material, such as silicon nitride is commonly used as an etch stop or etch mask material, particularly in connection with etch processes of silicon dioxide with a fluorinated etch chemistry. For example, in a conventional self-aligned etch process for forming a contact opening to an underlying active region on a semiconductor substrate, silicon nitride is usually used on top of a gate stack as an etch stop. The silicon nitride cap prevents overetching and ensures that the resulting contact hole is aligned directly atop the active region.

One of the problems in the prior art with forming a silicon nitride cap is the simultaneous formation of a silicon nitride layer on the back side of a semiconductor wafer. The particular problems depend on the process flow. For instance, where a low pressure chemical vapor deposition is used to deposit silicon nitride, both sides of the semiconductor wafer would receive deposits of silicon nitride. The presence of silicon nitride on the back side of the semiconductor wafer causes stress which deforms the shape of the semiconductor wafer, and can also potentially cause deformation of the crystal structure as well as cause defects in the circuit. Additionally, silicon nitride deposition is inherently a dirty operation having particulate matter in abundance which tends to reduce yield. When a low pressure chemical vapor deposition process is utilized, the silicon nitride layering on the back side of the semiconductor wafer must be removed later in the process flow.

It would be advantageous to have a method for providing an etch mask material that does not require removal after the etching is completed. Further, it would be an advancement in the art to provide an alternative to silicon nitride for use as an etch stop in self-aligned contact formation.

SUMMARY OF THE INVENTION

The present invention relates to etching doped silicon dioxide from a structure in a process that is selective to undoped silicon dioxide. According to the invention, a structure is provided having a first region substantially composed of doped silicon dioxide and a second region substantially composed of undoped silicon dioxide. The first and second regions are configured to define a topographical structure to be formed by the selective etch process. A high density plasma system is used to remove doped silicon dioxide from the topographical structure.

A high density plasma system, as defined herein, has two electrodes. The two electrodes are the upper electrode and lower electrode. There is a space or gap between the two electrodes. The upper electrode is sometimes referred to as the upper window. An inductively coupled plasma is usually applied to the upper electrode (or upper window). Sometimes, the power that is applied to the upper electrode can be divided into two parts, such as an outer coil and an inner coil. The power that is applied to the upper electrode is usually referred to, and is referred to herein, as the source power.

A semiconductor substrate of a wafer being etched is situated on the lower electrode where an optional RF power is usually applied thereto. This power is usually referred as to the bias power. The etch under these condition has a plasma density not less than about $10^9$ cm$^{-3}$, and the operating pressure is usually at 10 Millitorr (mT) or below.

A high density plasma source with a fluorinated etch chemistry is applied to the structure such that an inductively-coupled power is delivered to the upper electrode in an amount less than about 1000 Watts (W) per 200 mm-diameter wafer surface. Stated otherwise, the source power density can be expressed as an amount less than about 0.032 W/mm$^2$ or 19.89 W/in$^2$. Accordingly, doped silicon dioxide is removed from the structure at a material removal rate that is greater than the rate of removal of undoped silicon dioxide.

In a reactive ion etcher (RIE), only the bottom electrode where the wafer is situated is powered. Thus, the bottom electrode is preferably the same size as the wafer. As such, the power density is defined as the ratio between the power and the wafer surface area. In a high density etcher, however, the source power which generates a plasma in the etcher is applied to the upper electrode or upper window. A coil is situated on the upper window. There is generally no definite shape or size of the coil that sits on the upper window and the size or volume of the plasma zone is not necessarily the same as the size of the coil. As such, the power density is defined as the source power applied to the upper window over the surface area of the wafer situated upon the bottom electrode.

The method of the invention extends to any structure from which doped silicon dioxide may be removed selectively to undoped silicon dioxide. The invention has been found particularly advantageous for use in semiconductor structure fabrication. In one embodiment, a doped silicon dioxide layer is formed over a semiconductor substrate. An undoped silicon dioxide layer is then formed over the doped silicon dioxide and patterned to provide one or more openings therein extending to the doped silicon dioxide layer. The high density plasma etch process described above is conducted, thereby selectively removing doped silicon dioxide through the openings in the pattern and forming a predetermined topographical structure. The undoped silicon dioxide layer acts as an etch mask during the etching process. Under this embodiment, the undoped silicon dioxide etch mask does not need to be removed after the etching process is completed.

According to another embodiment of the invention, the positions of the doped and the undoped silicon dioxide layers within the structure are reversed. The undoped silicon dioxide layer is formed over the semiconductor substrate, with the doped silicon dioxide layer formed thereupon. Photoresist is deposited and patterned on doped silicon dioxide to provide openings. The high density plasma etch is directed onto the structure, thereby removing doped silicon dioxide to form an opening that terminates at the undoped silicon dioxide layer.

The invention is useful with a variety of applications wherein doped silicon dioxide is etched from a semiconductor structure. For example, undoped silicon dioxide layers may be positioned both over and under a doped silicon dioxide layer. Alternatively, the invention may be used for forming a self-aligned contact hole to a contact surface on a semiconductor substrate. The self-aligned contact hole is formed by first providing a multilayer structure over the semiconductor substrate that comprises a thin silicon dioxide layer, a layer of conductor material, and a refractory metal silicide layer. By way of example, the multilayer structure may include a gate oxide layer, a polysilicon layer, and a refractory metal silicide layer successively formed over a semiconductor substrate. An undoped silicon dioxide layer is then formed over the multilayer structure.

The multilayer structure is patterned to form the designated topography, with openings extending to the semiconductor substrate. Doped silicon dioxide is next formed over the semiconductor substrate. A patterned etch mask layer is utilized to expose selected portions of the doped silicon dioxide layer that are intended to be etched. One example of a topographical structure created utilizing this process are gate stacks. A high density plasma etch as described above is conducted to selectively and anisotropically remove doped silicon dioxide such that a self-aligned contact opening extends to a contact surface on the semiconductor substrate between the gate stacks.

As can be seen, the present invention provides undoped silicon dioxide as an alternative to silicon nitride that has previously been used in many selective etch processes. In other applications, the use of photoresist material that must be removed after etching is reduced or eliminated under the invention. Further, the etching process of the invention may be conducted with high density plasma etchers.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

Figure 1:
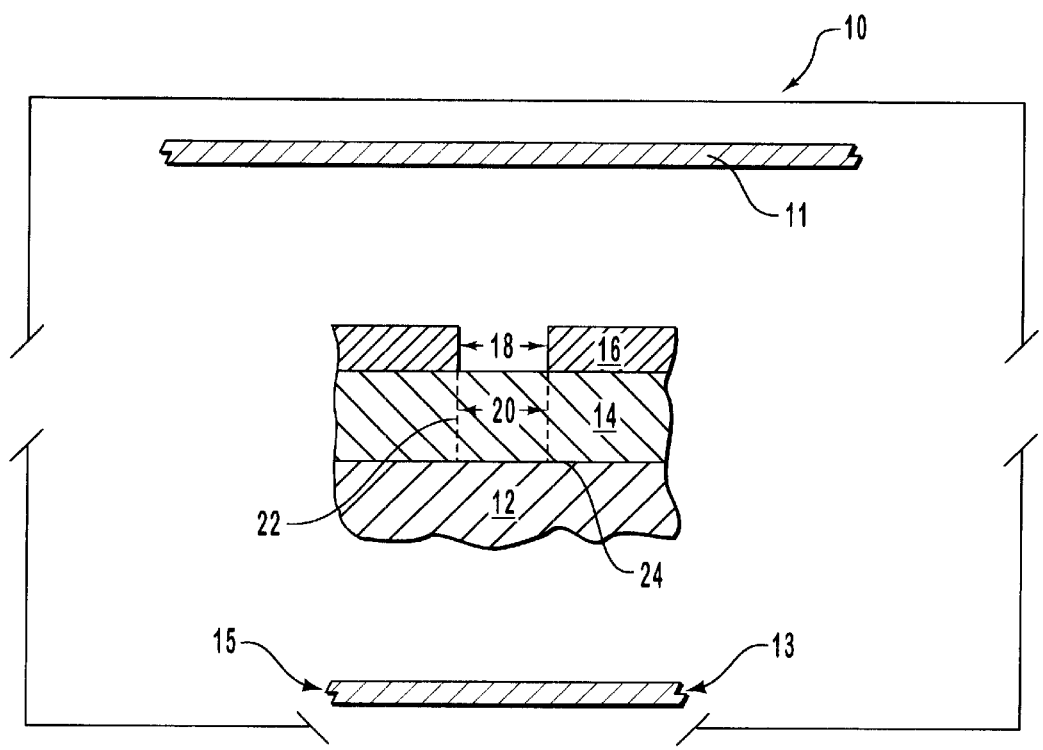
FIG. 1 is a partial cross-sectional elevation view of a multilayer structure in a high density plasma etcher that is etched according to one embodiment of the invention. An undoped silicon dioxide layer is formed over a doped silicon dioxide layer and patterned. A high density plasma etch is conducted to selectively remove doped silicon dioxide.

The present invention relates to etching doped silicon dioxide from a structure in a process that is selective to undoped silicon dioxide. According to the invention, a structure is provided having a first region substantially composed of doped silicon dioxide and a second region substantially composed of undoped silicon dioxide. The first and second regions are configured to define a topographical structure to be formed by the selective etch process. Often, the first and second regions will be in physical contact one with another. A high density plasma etch with a fluorinated etch chemistry is applied to the structure such that a power density is delivered to both of the first and second regions in an amount less than about 1000 W per 200-mm diameter wafer. Accordingly, doped silicon dioxide is removed from the structure at a material removal rate that is greater than the rate of removal of undoped silicon dioxide.

An important feature of the invention is the development of methods of removing doped silicon dioxide selective to undoped silicon dioxide using a high density plasma etch process. As used herein, "high density plasma etch" is any plasma etch conducted in a high density plasma etcher in which there is an ion density higher than about $10^9$ ions/cm$^3$. This is contrasted with other plasma etch processes, such as reactive ion etching (RIE) and magnetically enhanced reactive ion etching (MERIE), which generally have ion densities in a range from about $10^8$ ions/cm$^3$ to less than about $10^9$ ions/cm$^3$. High density plasma etchers are notable for the high material removal rates which they produce. Typical high density plasma etch rates of silicon dioxide are in a range from about 5,000 Å/min to about 10,000 Å/min. RIE processes ordinarily do not exceed about 5,000 Å/min.

As used herein, "material removal rate" is expressed as a unit length per unit time. A material removal rate as expressed herein is measured only over the amount of time during which a surface of the material is actually exposed to an etch chemistry. For example, if a certain embodiment includes a second layer exposed by etching an opening through a first layer, the material removal rate of the first layer is calculated only during the time in which the opening is being formed therein, while the material removal rate of the second layer is measured only during the time after which a surface thereof is exposed to an etch chemistry through the opening. This method of measuring material removal rates allows objective and consistent comparison between surfaces that may be exposed during different lengths of time.

High density etchers may be used in a range of operating parameters, including those of power density, which is defined as the energy rate delivered to a surface of a structure to be etched per unit area. In nearly all previous applications in the art, high density plasma etchers have been used at or near their maximum power density, in a range of about 1000 W per 200-mm diameter wafer or higher. This range of power density is referred to herein as "high power density." High density plasma etchers are also capable of delivering less energy, including "medium power density" which is herein defined as a range from less than about 1000 W per 200-mm diameter wafer and "low power density" which is herein defined as a range less than about 300 W per 200-mm diameter wafer. Thus, as the terms are used herein, high density plasma etch processes within high density plasma etchers may be conducted at a "medium power density" or a "high power density."

It might be expected that a reduction of power density in a high density plasma etch would significantly reduce the rate at which doped silicon dioxide is thereby removed. However, it has been found that the material removal rate of doped silicon dioxide in high density plasma etching is only a weak function of the power density applied thereto. In other words, a reduction of power density to doped silicon dioxide has been found to result in only a small or no reduction in the removal rate of doped silicon dioxide. It has also been observed that the material removal rate of undoped silicon dioxide is a strong function of power density. A reduction of power density in a high density plasma etch process significantly reduces the removal rate of undoped silicon dioxide.

At high power densities, there is little or no selectivity between doped and undoped silicon dioxide. However, as the removal rate of undoped silicon dioxide significantly drops at medium and low power densities, there is substantial selectivity between doped and undoped silicon dioxide. At medium and lower power density settings, doped silicon dioxide may be removed according to the invention at rates 10 times or more greater than the material removal rate of undoped silicon dioxide removal. While not fully understood, it is believed that deposition of polymers on exposed undoped silicon dioxide during the high density plasma etch plays some role in providing the selectivity to undoped silicon dioxide. Such polymers are generated during the chemical reactions between the etch chemistry and the material that is removed during the etch.

The general etch process according to the preferred embodiments of the invention is conducted by placing a wafer or other structure to be etched within a chamber of a high density plasma etcher. A typical wafer is roughly circular and has a diameter of about 8 inches. Medium and low power densities are generated by controlling the power supply delivered to an upper electrode and a lower electrode within the chamber of the high density plasma etcher. Accordingly, for an 8 inch wafer, a source power is applied to the upper electrode in a range from about 500 Watts to about 1,000 Watts for medium power density or in a range less than about 500 Watts for low power density. A bias power, $P_B$, is delivered to the lower electrode at an amount defined as $P_S-200 \leq P_B \leq P_S+200$, where $P_S$ is the source power as defined above. Preferably, $P_S-100 \leq P_B \leq P_S+100$, and most preferably, the source power and the bias power are about equal.

The high density plasma etcher preferably uses a fluorinated etch chemistry selected from the group of $C_2F_6$, $CF_4$, $C_3F_8$, $C_4F_{10}$, $CH_2F_2$, $CHF_3$, $C_2HF_5$, $CH_3F$ and combinations thereof. There are other fluorinated etchants in a substantially gas phase that can be employed during the etching of the structure. An inert gas is often used in combination with the fluorinated etchant. Argon, nitrogen, and helium are examples of such an inert gas. The most preferred gasses, however, are $C_2HF_5$, $CH_2F_2$, $CHF_3$ and Ar. Alternatively $CH_3F$ may be used in place of $CH_2F_2$. In particular, preferred etchants include a fluorine deficient gas, which is defined as a gas without enough fluorine atoms to saturate the bonding for the carbon atoms.

As currently practiced, temperature during a high density plasma etch is controlled by cooling the lower electrode with a fluid, such as water, having a temperature in a range from about 0° C. to about 30° C. Often, the upper limit of acceptable wafer temperatures is defined by the softening temperature of photoresist material at about 130° C. The appropriate operating pressure is a function of the etch chemistry, among other factors, and will be understood by one skilled in the art. In most cases, however, the preferred pressure for a high density plasma etcher will be in a range from about 1 millitorr to about 10 millitorr.

The high density plasma etch with the associated medium and low power densities as disclosed above are generally applicable to the various embodiments of the inventive methods as described herein. In an example of an etch process by which doped silicon dioxide was removed from a structure at a rate at least 10 times greater than the removal rate of undoped silicon dioxide, an 8 inch semiconductor wafer was placed within a high density plasma etcher. A source power of about 800 Watts was delivered to the upper electrode, and a bias power of about 800 Watts was applied to the lower electrode. The etch was conducted in a chemistry of $C_2HF_5$, $CHF_3$ and $CH_2F_2$, in a ratio of about 4:3:3, and at an operating pressure of about 3 millitorr.

FIGS. 1–7 illustrate methods of the invention as directed to several structures that may be formed by removal of doped silicon dioxide selective to undoped silicon dioxide. FIG. 1 shows a high density plasma etcher 10 having an upper electrode 11, a lower electrode 13, and a stream of a cooling fluid 15. A semiconductor substrate 12 that preferably comprises silicon, and may be substantially composed of monocrystalline silicon, is also illustrated in FIG. 1. Overlying semiconductor substrate 12 is a first layer 14 substantially composed of doped silicon dioxide. Preferably, first layer 14 and other doped silicon dioxide structures disclosed herein are substantially composed of borophosphosilicate glass (BPSG), borosilicate glass (BSG), or phosphosilicate glass (PSG). Most preferably, first layer 14 is substantially composed of silicon dioxide having a boron dopant concentration of about 3% or more by weight and a phosphorus dopant concentration of about 3% or more by weight. For purposes of this disclosure "first layer" refers to a layer substantially composed of doped silicon dioxide.

A second layer 16 substantially composed of undoped silicon dioxide is formed over first layer 14. For purposes of this disclosure, "second layer" refers to a layer substantially composed of undoped silicon dioxide. The undoped silicon dioxide of second layer 16 may be formed, for example, by a thermal process, by a plasma enhanced deposition process, by conventional TEOS precursor deposition that is preferably rich in carbon or hydrogen, or by a precursor of gaseous silane ($SiH_4$) with oxygen. Second layer 16 is processed to form a first selected pattern 18 through which first layer 14 is exposed.

The structure seen in FIG. 1 is then etched according to the high density plasma etch described above. The preferred etch removes doped silicon dioxide anisotropically from first layer 14 in a region aligned with first selected pattern 18 down to semiconductor substrate 12. The high density plasma etch will form an opening 20 (shown in phantom) having lateral dimensions substantially corresponding to those of first selected pattern 18. Moreover, opening 20 will be defined by a contact surface 24 situated on semiconductor substrate 12 and a sidewall 22 that is substantially orthogonal to semiconductor substrate 12. Second layer 16 prevents the high density plasma etch from removing material from first layer 14 except as aligned with first selected pattern 18. After formation of opening 20, a contact plug substantially composed of a conductive material may be formed within opening 20 to provide electrical connection between contact surface 24 and overlying layers. Such a contact plug is defined by first selected pattern 18 and opening 20 and is illustrated by phantom lines in FIG. 1. The contact plug is formed according to well-understood processes in the art. Likewise, in other embodiments disclosed herein, a structure such a contact plug may be formed in contact openings that extend to a contact surface on a semiconductor substrate.

Figure 2:
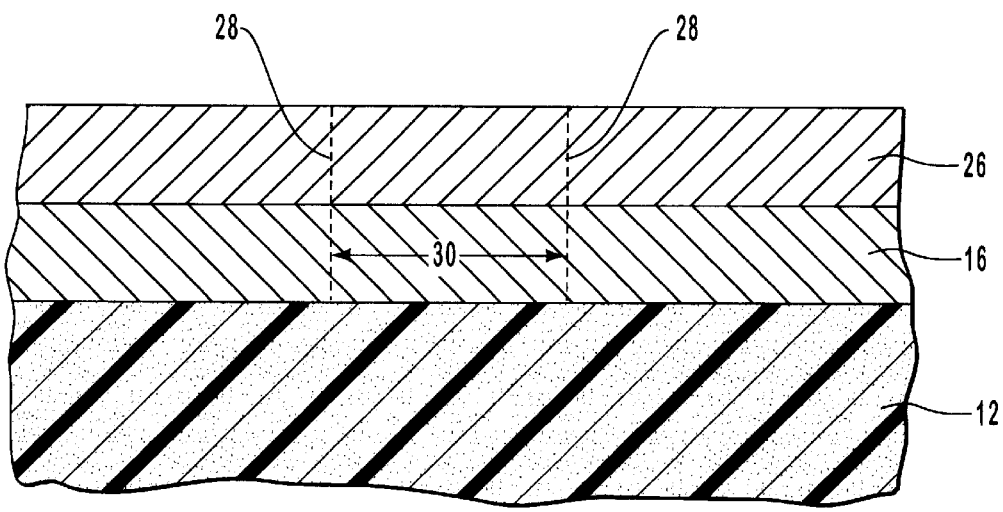
FIG. 2 is a partial cross-sectional elevation view of a preliminary step according to another embodiment of the invention, wherein an opening is formed in an undoped silicon dioxide layer.
Figure 3:
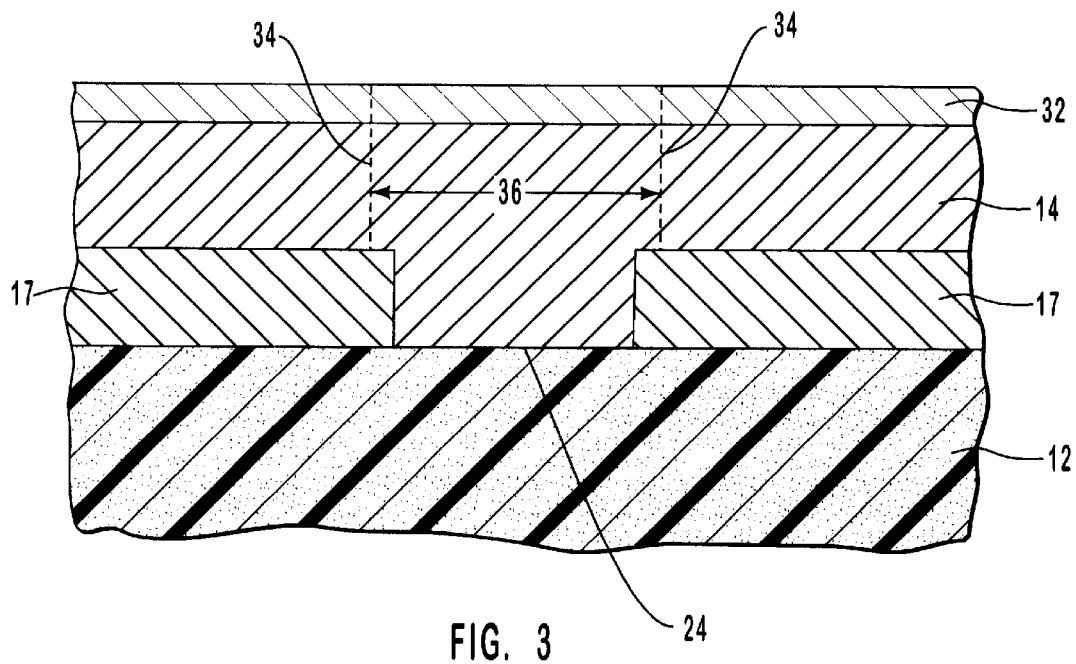
FIG. 3 is a partial cross-sectional elevation view of the structure of FIG. 2. A doped silicon dioxide layer is formed and selectively removed with a high density plasma etch such that the underlying undoped silicon dioxide layer acts as an etch stop.

FIGS. 2 and 3 depict another structure to which the etch process of the invention is applied wherein doped silicon dioxide is formed over undoped silicon dioxide. As illustrated in FIG. 2, a second layer 16 substantially composed of undoped silicon dioxide is formed over a semiconductor substrate 12. The undoped silicon dioxide may be formed by any conventional process, including a thermal process, a plasma enhanced deposition process, a conventional TEOS precursor deposition that is preferably rich in carbon or hydrogen, or a precursor of gaseous silane ($SiH_4$) with oxygen.

A photoresist layer 26 is formed over second layer 16 and patterned to produce a first selected pattern 28. Second layer 16 is then anisotropically etched through first selected pattern 28 to selectively remove undoped silicon dioxide therefrom. The anisotropic etch of second layer 16 may be any conventional etch process used in the art. Accordingly, opening 30 (shown in phantom) is formed through second layer 16, thereby exposing semiconductor substrate 12 and forming undoped silicon dioxide caps 17 as seen in FIG. 3. A first layer 14 substantially composed of doped silicon dioxide is deposited over undoped silicon dioxide caps 17 and semiconductor substrate 12 as a passivation layer. An etch mask layer 32 is formed over first layer 14, and may be substantially composed of undoped silicon dioxide. Alternatively etch mask layer 32 may consist of a photoresist material or another suitable material that is resistant to a high density plasma etch. Etch mask layer 32 is patterned to form second selected pattern 34 substantially vertically aligned with opening 30.

The structure seen in FIG. 3 is then etched according to the high density plasma etch of the invention as described above. The preferred etch removes doped silicon dioxide anisotropically from first layer 14 in a region aligned with second selected pattern 34 down to semiconductor substrate 12 and second layer 16. The high density plasma etch will form contact opening 36 having lateral dimensions substantially corresponding to those of second selected pattern 34 and opening 30. Undoped silicon dioxide caps 17 prevent overetching of contact opening 36, restricting the extent of exposure of semiconductor substrate 12 to contact surface 24 that is positioned between undoped silicon dioxide caps 17. Further, etch mask layer 32 prevents the high density plasma etch from removing material from first layer 14 except as aligned with second selected pattern 34. Accordingly, contact opening 36 is self-aligned with contact surface 24. The high density plasma etch of the invention that is selective to undoped silicon dioxide avoids the need to use silicon nitride as an etch stop structure.

A further embodiment of the method of the invention is used to form one or more gate stacks as illustrated in FIGS.

4 and 5. A multilayer structure 50 is formed over semiconductor substrate 12. Multilayer structure 50 comprises a gate oxide layer 38 that covers semiconductor substrate 12. Gate oxide layer 38 may be relatively thin in comparison with the other layers of multilayer structure 50. A polysilicon layer 40 is formed over gate oxide layer 38. Overlying polysilicon layer 40 is a refractory metal silicide layer 42. A known benefit of refractory metal silicides is their low resistivity. Refractory metal silicide layer 42 for purposes of the invention described herein includes a silicide of at least one of titanium, chromium, tantalum, platinum, tungsten and zirconium, and also molybdenum. Preferably, refractory metal silicide layer 42 is substantially composed of tungsten silicide ($WSi_x$).

Figure 5:
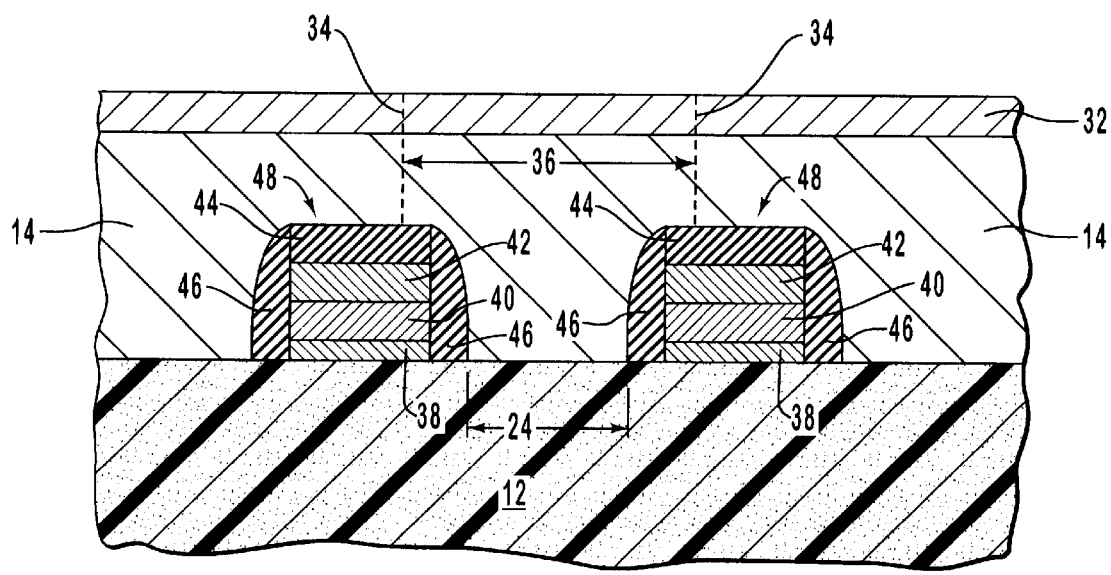
FIG. 5 is a partial cross-sectional elevation view of formation of a contact opening between a pair of gate stacks. The gate stacks have an upper undoped silicon dioxide layer and undoped silicon dioxide spacers to which a high density plasma etch is selective.

Overlying refractory metal silicide layer 42 is a second layer 16 that is substantially composed of undoped silicon dioxide which can be formed by any known means including thermally, by plasma enhanced deposition, by a conventional TEOS precursor deposition that is preferably rich in carbon or hydrogen, or by a precursor of gaseous silane ($SiH_4$) with oxygen. Next, a photoresist layer 26 is provided and patterned over second layer 16 to form first selected pattern 28. Multilayer structure 50 is anisotropically etched through first selected pattern 28 to selectively remove material therefrom so as to form gate stacks 48 as illustrated in FIG. 5. The etch of multilayer structure 50 may be any conventional etch process used in the art. Each gate stack 48 has an undoped silicon dioxide cap 44 thereon which is formed during the etch of second layer 16.

As depicted in FIG. 5, a spacer 46 is positioned on a lateral surface of each gate stack 48. Spacers 46 are formed by subjecting a layer of silicon nitride deposited over gate stacks 48 to a spacer etch. Spacers 46 are generally perpendicular to semiconductor substrate 12. Alternatively, spacers 46 can be substantially composed of undoped silicon dioxide. As such, both spacers 46 and undoped silicon dioxide caps 44 can be made from the same materials and each acts as an etch stop.

Upon formation of gate stacks 48, a contact surface 24 is defined therebetween upon semiconductor substrate 12. At this point in the processing, a first layer 14, substantially composed of doped silicon dioxide, and preferably of a material such as PSG, BSG, or BPSG, is deposited over gate stacks 48 and semiconductor substrate 12. An etch mask layer 32 is then applied over first layer 14. Etch mask layer 32 is processed to create a second selected pattern 34 that is shown in phantom. The structure of FIG. 5 is then etched according to the high density plasma etch of the invention as described above. The preferred etch removes doped silicon dioxide anisotropically from first layer 14 in a region aligned with second selected pattern 34 and between gate stacks 48 to expose contact surface 24. Undoped silicon dioxide caps 44 and spacers 46 prevent overetching into gate stack 48 and restrict exposure of semiconductor substrate 12 to contact surface 24. Accordingly, contact opening 36 is defined by contact surface 24 and by spacers 46.

Moreover, spacers 46 and undoped silicon dioxide cap 44 protect gate stacks 48 from the high density plasma etch. The etch removes doped silicon dioxide from first layer 14 at a material removal rate greater than that of undoped silicon dioxide cap 44 and silicon nitride or undoped silicon dioxide spacers 46. Preferably, the etch has a material removal rate for doped silicon dioxide is at least 10 times higher than that of undoped silicon dioxide. As such, contact opening 36 is self-aligned between spacers 46 of gate stacks 48. The self-aligning aspect of contact opening 36 is due to the selectivity of the etch which assures that even in cases of misalignment of second selected pattern 34, the high density plasma etch of first layer 14 will properly place contact opening 36 directly on contact surface 24 between adjacent spacers 46. The high density plasma etch also produces a material removal rate of doped silicon dioxide that is greater, and preferably at least 10 times greater, than removal rates of semiconductive material from semiconductor substrate 12, any silicon nitride that is found in spacers 46, and any photoresist material that is found in etch mask layer 32.

Figure 4:
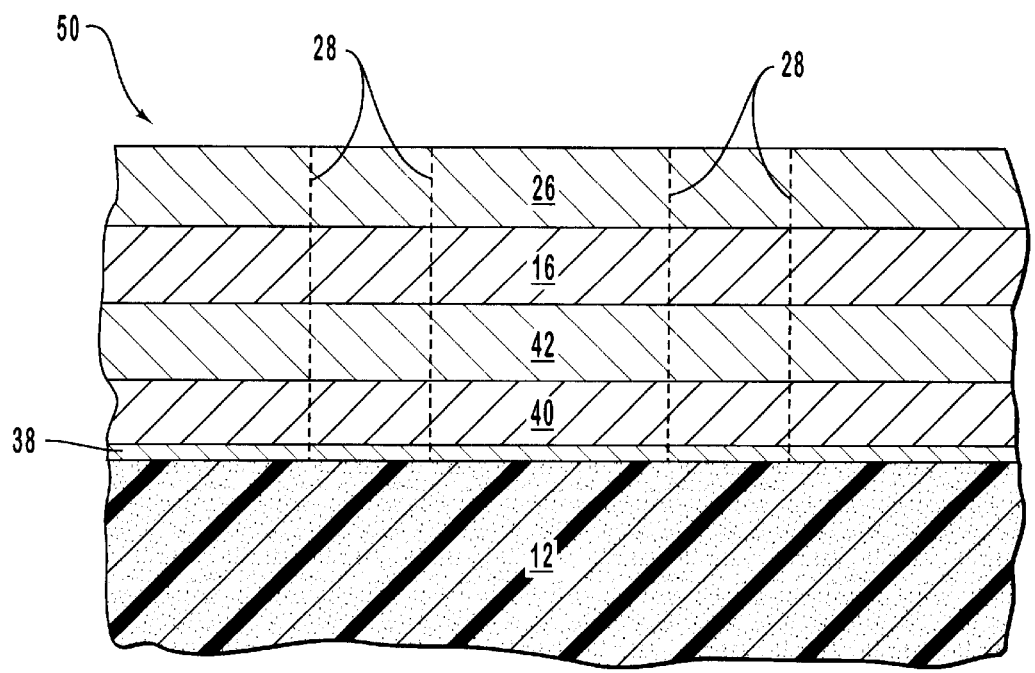
FIG. 4 is a partial cross-sectional elevation view of a structure from which gate stacks are to be formed according to the invention.
Figure 6:
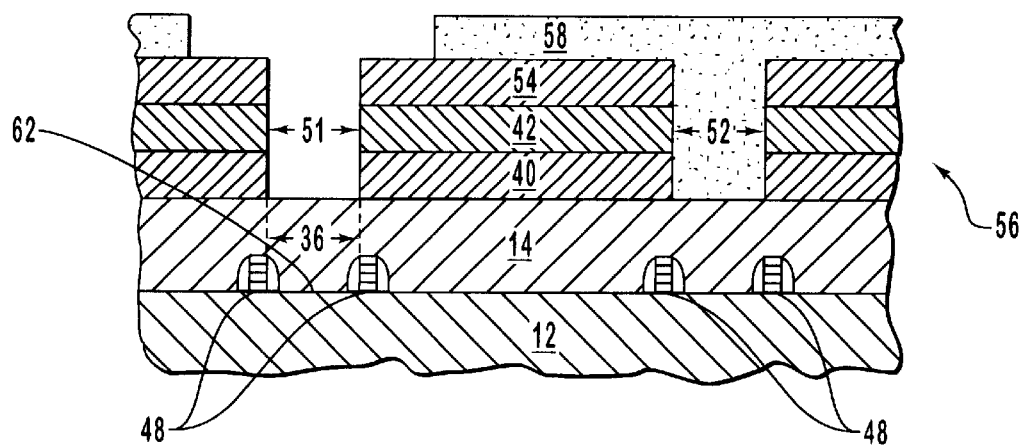
FIG. 6 is a partial cross-sectional elevation view of another embodiment of the invention in which two contact openings are successively formed. Undoped silicon dioxide is used as both an etch stop and an etch mask during the formation of contact openings between pairs of gate stacks. A photoresist layer is used to substantially fill a second opening during etching through a first opening in an intermediate step of the process.

FIG. 6 illustrates formation of a contact opening between a pair of gate stacks as conducted in FIGS. 4 and 5, with an additional structure formed over first layer 14. In general, etch mask layer 32 of FIG. 5 is replaced with an upper multilayer structure 56 as seen in FIG. 6. In particular, upper multilayer structure 56 comprises a polysilicon layer 40, a refractory metal silicide layer 42, and an undoped silicon dioxide layer 54 that are successively formed over first layer 14. A primary opening 51 and a secondary opening 52 as shown in FIG. 6 are formed within upper multilayer structure 56. Primary opening 51 is positioned generally over one pair of gate stacks 48, while secondary opening 52 is located over another pair of gate stacks 48. Primary opening 51 is provided to align a primary high density plasma etch of first layer 14.

A photoresist layer 58 is then formed on undoped silicon dioxide layer 54, such that secondary opening 52 is substantially filled, while primary opening 51 remains exposed. The photoresist pattern is such that the alignment with primary opening 51 is not critical. A high density plasma etch of the invention as described above is then applied. In particular, doped silicon dioxide is removed from first layer 14 and contact opening 36 is formed therein as described above in reference to FIG. 5. Spacers and undoped silicon dioxide caps of gate stacks 48 are etch stops for the etch process and direct the etch so as to be self-aligning with contact surface 24. In addition, undoped silicon dioxide layer 54 of upper multilayer structure 56 is an etch mask that protects underlying material from the etch process in this embodiment. While a high density plasma etch is preferred, the structure of FIG. 6 may be etched using any suitable etching system that is selective to both photoresist layer 58 and to undoped silicon dioxide layer 54 but is not selective to doped silicon dioxide in first layer 14.

Figure 7:
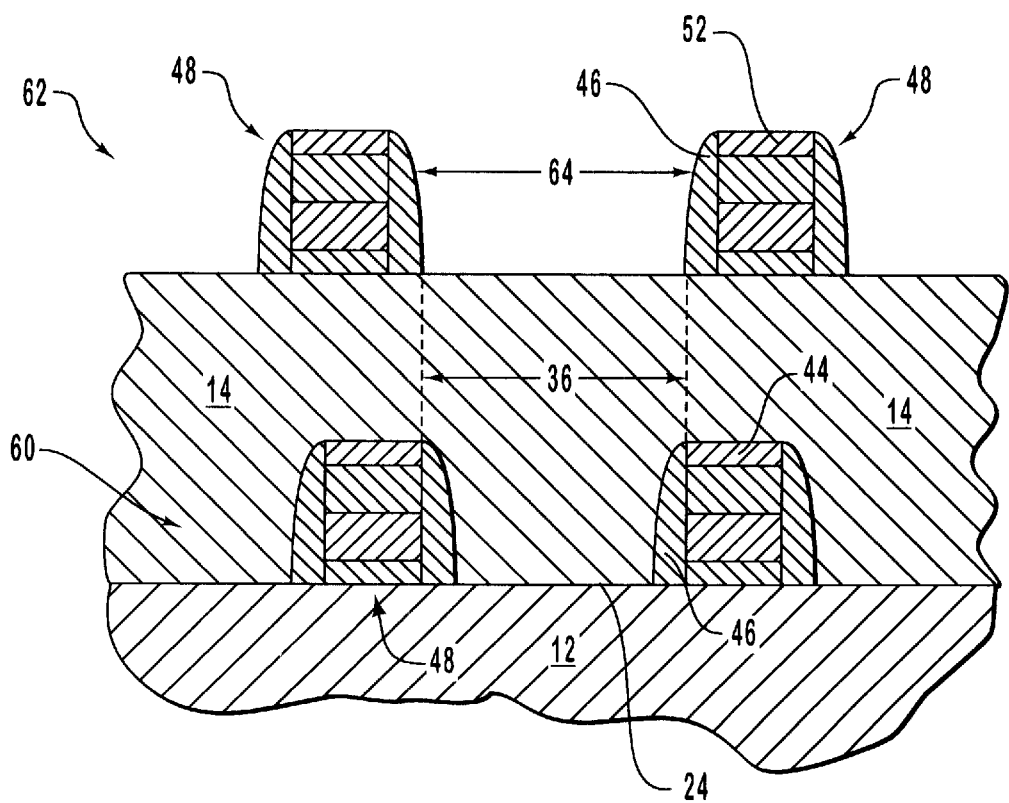
FIG. 7 is a partial cross-sectional elevation view of a variation of the embodiment of FIG. 5. An upper pair of gate stacks, each of which has an undoped silicon dioxide upper layer and an undoped silicon dioxide spacer, is positioned to be an etch mask for the high density plasma etch. A lower pair of gate stacks are positioned to be an etch stop and to form a self-aligned contact opening.

FIG. 7 illustrates another method for using a high density plasma etch process for selectively removing doped silicon dioxide, whereby contact openings to a semiconductor substrate are formed. In this embodiment, an upper series of gate stacks 48 are substituted for the etch mask layer 32 of FIG. 5. A lower series of substantially parallel gate stacks 48 indicated generally at 60 are formed on semiconductor substrate 12, preferably according to the process disclosed above in reference to gate stacks 48 of FIGS. 4 and 5. A first layer 14 substantially composed of doped silicon dioxide is positioned on first series 60 and is supported by semiconductor substrate 12. A second series of substantially parallel gate stacks 48 indicated generally at 62 is supported by first layer 14. Again, second series 62 of gate stacks 48 are preferably formed according to the process disclosed above in reference to gate stacks 48 of FIGS. 4 and 5.

In FIG. 7, each gate stack 48 of first series 60 has a longitudinal axis extending into the page that defines a directional component of first series 60. Likewise, each gate stack 48 of second series 62 has a longitudinal axis extending into the page that defines a directional component of second series 62. In the embodiment illustrated in FIG. 7, the directional component of first series 60 is substantially parallel to the directional component of second series 62.

Alternatively, first and second series 60 and 62 may be aligned in some other manner, including but not limited to being positioned such that the respective directional components thereof are substantially orthogonal with respect to each other.

Gate stacks 48 of second series 62 define a second selected pattern 64 having a series of elongated openings between adjacent gate stacks 48 of second series 62 and substantially parallel thereto. A high density plasma etch as described herein is applied through second selected pattern 64 to form a contact opening 36 as indicated in phantom. Undoped silicon dioxide cap 52 on each gate stack 48 of second series 62 acts as an etch mask, thereby preventing the high density plasma etch from removing material from first layer 14 except as aligned with second selected pattern 64. Spacers 46 of second series 62, whether they are substantially composed of silicon nitride or undoped silicon dioxide, also act as an etch mask. Undoped silicon dioxide caps 44 and spacers 46 of first series 60 act as an etch stop surface, thereby preventing the etching system from substantially removing material from first series 60. The combined function of the etch stop and etch mask structures of FIG. 7 provide contact opening 36 that is self-aligned with contact surface 24.

The present methods of the invention have application to a wide variety of structures that are not limited to those used in manufacturing integrated circuits and the like. Any structure containing both undoped and doped silicon dioxide that is susceptible to etching is contemplated by the invention. A high density plasma etch may be applied to such a structure to remove doped silicon dioxide selectively to undoped silicon dioxide to form various types of structures other than those specifically described herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for removing doped silicon dioxide, said method comprising:
    providing a structure including:
        a first portion comprising doped silicon dioxide; and
        a second portion comprising undoped silicon dioxide;
    exposing said first portion and said second portion to a high density plasma etch process in a high density plasma etcher by:
        placing said structure within a high density plasma chamber having an upper electrode and a lower electrode; and
        applying a source power to said upper electrode and a bias power to said lower electrode such that a power density of less than about 1000 Watts (W) per 200 mm-diameter wafer surface is provided to said structure, said bias power being applied in a range from about 200 Watts less than said source power to about 200 Watts greater than said source power, thereby selectively removing doped silicon dioxide from said first portion at a material removal rate that is greater than the material removal rate of undoped silicon dioxide from said second portion.

2. A method as recited in claim 1, wherein said first portion is in contact with said second portion.

3. A method as recited in claim 1, wherein exposing said first portion and said second portion to a high density plasma etch process further comprises exposing said first portion and said second portion to an ion density higher than about $10^9$ ions/cm$^3$.

4. A method as recited in claim 1, wherein the high density plasma etch process is conducted with a fluorinated chemical etchant.

5. A method as recited in claim 1, wherein said bias power is applied in a range from about 100 Watts less than said source power to about 200 Watts greater than said source power.

6. A method as recited in claim 1, wherein said bias power is about equal to said source power.

7. A method as recited in claim 1, wherein said material removal rate of said doped silicon dioxide is in a range from about 5,000 Å/mm to about 10,000 Å/mm.

8. A method as recited in claim 1, wherein exposing said first portion and said second portion to a high density plasma etch process comprises:
    placing said structure within a high density plasma chamber; and
    exposing said structure to an etch chemistry including $C_2HF_5$, $CHF_3$, and $CH_2F_2$ at a pressure of less than about 5 millitorr.

9. A method as recited in claim 1, wherein exposing both of said first portion and said second portion to a high density plasma etch process comprises:
    placing said structure within a high density plasma chamber having a lower electrode cooled by a fluid having a temperature in a range from about 0° C. to about 40° C.

10. A method as recited in claim 1, wherein said doped silicon dioxide is doped with boron at a concentration of at least about 3% by weight.

11. A method as recited in claim 1, wherein said doped silicon dioxide layer is doped with phosphorus at a concentration of at least about 3% by weight.

12. A method as recited in claim 1, wherein said undoped silicon dioxide layer contains no more than about 3% by weight of boron and contains no more than about 3% by weight of phosphorus.

13. A method as recited in claim 1, wherein said doped silicon dioxide is removed at a material removal rate at least 10 times greater than the material removal rate of said undoped silicon dioxide.

14. A method as recited in claim 13, wherein said material removal rate of said doped silicon dioxide is in a range from about 5,000 Å/mm to about 10,000 Å/mm.

15. A method for removing doped silicon dioxide, said method comprising:
    providing a structure including a first portion comprising doped silicon dioxide and a second portion comprising undoped silicon dioxide;
    placing said structure in a chamber of a high density etcher having a upper electrode and a lower electrode; and
    exposing said first portion and said second portion to a high density plasma etch process including:
        applying a source power to said upper electrode; and
        applying a bias power to said lower electrode, said bias power being in a range from about 200 Watts less than said source power to about 200 Watts greater than said source power, such that a power density less than or equal to about 1000 W source power per 200-mm diameter wafer surface is provided, said doped silicon dioxide being selectively removed at a material removal rate that is at least 10 times greater than the material removal rate of undoped silicon dioxide, said material removal rate of doped silicon dioxide being in a range from about 5,000 Å/min to about 10,000 Å/min.

16. A method for removing doped silicon dioxide, said process comprising:

provideng a structure including a first portion comprising doped silicon dioxide and a second portion comprising undoped silicon dioxide;

placing said structure in a high density etcher having a upper electrode and a lower electrode; and exposing said first portion and said second portion to a high density plasma etch process including:
introducing an etchant selected from the group consisting of $C_2F_6$, $CF_4$, $C_3F_8$, $C_4F_{10}$, $CH_2F_2$, $CHF_3$, $C_2HF_5$, $CH_3F$, and combinations thereof;
applying a source power to said upper electrode;
applying a bias power to said lower electrode, said bias power being in a range from about 200 Watts less than said source power to about 200 Watts greater than said source power;
providing an ion density within said chamber of not less that about $10^9$ ions/cm$^3$; and
providing a source power density less than or equal to about 1000 W per 200-mm diameter wafer surface to a surface of said structure, said doped silicon dioxide being selectively removed at a material removal rate that is at least 10 times greater than the material removal rate of undoped silicon dioxide, said material removal rate of doped silicon dioxide being in a range from about 5,000 Å/min to about 10,000 Å/min.

17. A process for removing doped silicon dioxide, said process comprising:

forming a first layer on a substrate, said first layer comprising doped silicon dioxide;

forming a second layer on said first layer, said second layer comprising undoped silicon dioxide;

forming an opening through said second layer to expose a surface on said first layer; and conducting a high density plasma etch on said first layer and on said second layer in a high density plasma etcher having a lower electrode by applying:
a bias power to the lower electrode; and
a source power density to both of said first layer and said second layer in an amount less than or equal to about 1000 W per 200-mm diameter wafer surface, wherein said bias power is in a range from about 200 Watts less than said source power density to about 200 Watts greater than said source power density, thereby selectively removing doped silicon dioxide from said first layer through said opening at a material removal rate that is greater than the material removal rate of undoped silicon dioxide from said second layer.

18. A process as recited in claim 17, wherein said high density plasma etch removes said doped silicon dioxide at a material removal rate at least 10 times greater than that of said undoped silicon dioxide.

19. A process as recited in claim 17, wherein said high density plasma etch comprises etching said doped silicon dioxide with an etchant selected from the group consisting of $C_2F_6$, $CF_4$, $C_3F_8$, $C_4F_{10}$, $CH_2F_2$, $CHF_3$, $C_2HF_5$, $CH_3F$, and combinations thereof.

20. A process as recited in claim 17, wherein conducting said high density plasma etch exposes a surface on said substrate.

21. A process as recited in claim 17, further comprising forming an etch stop layer before forming said first layer, said etch stop layer being supported by said substrate and comprising undoped silicon dioxide, a portion of said etch stop layer being exposed by conducting said high density plasma etch.

22. A process as recited in claim 17, further comprising, after forming said first layer, forming at least one interleaving layer, wherein said at least one interleaving layer is positioned between said first layer and said second layer.

23. A process as recited in claim 22, wherein said at least one interleaving layer is comprises at least one material selected from the group consisting of silicides of molybdenum, chromium, tungsten, titanium, tantalum, platinum, zirconium, and combinations thereof.

24. A process as recited in claim 22, wherein said at least one interleaving layer comprises polysilicon.

25. A process as recited in claim 22, wherein said at least one interleaving layer comprises:
a polysilicon layer and a refractory metal silicide layer.

26. A process for forming a contact to a semiconductor substrate, said process comprising:

forming a first layer on a semiconductor substrate, said first layer comprising doped silicon dioxide;

forming a second layer, the second layer being patterned and on said first layer, said second layer comprising undoped silicon dioxide, and wherein a portion of said first layer under said pattern is exposed;

conducting a high density plasma etch on said first layer and on said second layer in a high density plasma etcher having a lower electrode by applying:
a bias power to the lower electrode; and
a source power density to said first layer and said second layer in an amount less than or equal to about 1000 W per 200-mm diameter wafer surface, wherein the bias power is in a range from about 200 Watts less than said source power density to about 200 Watts greater than said source power density, thereby selectively removing doped silicon dioxide from said first layer through said pattern to form an opening in said first layer, said opening being defined by an exposed contact surface on said semiconductor substrate and a sidewall substantially orthogonal to said exposed contact surface, said doped silicon dioxide being selectively removed from said first layer at a material removal rate that is greater than the material removal rate of undoped silicon dioxide from said second layer; and forming a contact plug comprising a conductive material on said exposed surface within said opening.

27. A process for removing doped silicon dioxide, said process comprising:

providing a multilayer structure having:
a first layer on a substrate, said first layer comprising doped silicon dioxide; and
a second layer on said first layer, said second layer being comprising undoped silicon dioxide, forming a primary opening and a secondary opening in said second layer, said primary opening and said secondary opening extending to said first layer;

forming a photoresist layer over said second layer, said photoresist layer at least partially filling said secondary opening and substantially not filling said primary opening;

conducting a high density plasma etch on said first layer and on said second layer through said primary opening in a high density plasma etcher having a lower electrode by applying:
  a bias power to the lower electrode; and
  a source power density to said first layer and to said second layer in an amount less than or equal to about 1000 W per 200-mm diameter wafer surface, wherein:
    the bias power is in a range from about 200 Watts less than said source power density to about 200 Watts greater than said source power density;
    said doped silicon dioxide is selectively removed from said first layer through said primary opening at a material removal rate that is:
      at least 10 times greater than the material removal rate of undoped silicon dioxide from said second layer; and
      greater than the material removal rate of photoresist material from said photoresist layer.

28. A process for removing doped silicon dioxide, said process comprising:
  forming a silicon dioxide-containing layer over a first series of gate stacks on a substrate;
  forming a second series of gate stacks on said silicon dioxide-containing layer, said second series defining at least one space between any two adjacent gate stacks of said second series, each said gate stack of said second series including:
    an undoped silicon dioxide-containing layer which defines an upper surface on each said gate stack of said second series; and
    a spacer in contact with said undoped silicon dioxide-containing layer, said spacer defining a lateral surface on each said gate stack of said second series; and
  conducting a high density plasma etch on said silicon dioxide-containing layer and on said undoped silicon dioxide-containing layer in a high density plasma etcher having a lower electrode by applying:
    a bias power to the lower electrode; and
    a source power density to said silicon dioxide-containing layer and to said undoped silicon dioxide-containing layer in an amount less than or equal to about 1000 W per 200-mm diameter wafer surface, said bias power being applied in a range from about 200 Watts less than said source power to about 200 Watts greater than said source power, thereby selectively removing at least silicon dioxide from said silicon dioxide-containing layer through said at least one space at a material removal rate that is greater than the material removal rate of undoped silicon dioxide from said undoped silicon dioxide-containing layer.

29. A process as recited in claim 28, wherein:
said spacer comprises undoped silicon dioxide; and
at least silicon dioxide is selectively removed from said silicon dioxide-containing at a material removal rate that is greater than the material removal rate of undoped silicon dioxide from said spacer.

30. A process as recited in claim 28, wherein said first directional component is parallel to said second directional component.

31. A process as recited in claim 28, wherein each said gate stack of said first series comprises:
a gate oxide layer on said substrate;
a polysilicon layer on said gate oxide layer;
a refractory metal silicide layer on said polysilicon layer;
an undoped silicon dioxide layer on said refractory metal suicide layer; and
a spacer comprising undoped silicon dioxide, said spacer being in contact with said gate oxide layer, said polysilicon layer, said refractory metal silicide layer, and said undoped silicon dioxide layer.

32. A process as recited in claim 28, wherein:
said gate stacks of said first series are parallel one with another, said first series defining a first directional component; and
said gate stacks of said second series are parallel one with another, said second series defining a second directional component.

33. A process as recited in claim 32, wherein said first directional component is orthogonal to said second directional component.

34. A process for removing doped silicon dioxide, said process comprising:
  forming a second layer over a semiconductor substrate, said second layer comprising undoped silicon dioxide;
  forming a first layer over said second layer, said first layer comprising doped silicon dioxide; and
  conducting a high density plasma etch on said first layer and on said second layer in a high density plasma etcher having a lower electrode by applying:
    a bias power to the lower electrode; and
    a source power density being applied to said first layer and to said second layer in an amount less than or equal to about 1000 W per 200-mm diameter wafer surface, said bias power being applied in a range from about 200 Watts less than said source power to about 200 Watts greater than said source power, said doped silicon dioxide being selectively removed from said first layer to expose a portion of said second layer, said doped silicon dioxide being removed at a material removal rate greater than the material removal rate of undoped silicon dioxide from said second layer.

35. A process as recited in claim 34, further comprising, prior to conducting a patterned photoresist layer over said first layer, wherein conduction said high density plasma etch comprises removing said doped silicon dioxide through said patterned photoresist layer.

36. A process as recited in claim 34, wherein a surface of said semiconductor substrate is exposed upon conducting said high density plasma etch, said material removal rate of said doped silicon dioxide being at least 10 times greater than the material removal rate of a semiconductive material from said semiconductor substrate.

37. A process as recited in claim 34, wherein said high density plasma etch has an ion density not less that about $10^9$ ions/cm$^3$.

38. A process as recited in claim 34, wherein said high density plasma etch is conducted at an operating pressure in a range from about 1 millitorr to about 10 millitorr.

39. A process as recited in claim 34, wherein conducting said high density plasma etch comprises using a fluorinated chemical etchant.

40. A process as defined in claim 39, wherein said fluorinated chemical etchant is selected from the group consisting of $C_2F_6$, $CF_4$, $C_3F_8$, $C_4F_{10}$, $CH_2F_2$, $CHF_3$, $C_2HF_5$, $CH_3F$, and combinations thereof.

41. A process for forming a contact opening, said process comprising:

providing a gate oxide layer over a semiconductor substrate comprising a semiconductor material;

providing a pair of gate stacks in spaced relation to one another on said gate oxide layer, each of said gate stacks having at least one conductive layer formed therein and an undoped silicon dioxide layer extending over said conductive layer, a contact surface on said semiconductor substrate being positioned between said pair of gate stacks;

forming a spacer comprising a spacer material adjacent to each of said gate stacks;

forming a doped silicon dioxide layer over said pair of gate stacks and over said contact surface; and high-density-plasma etching in a high density plasma etcher having a lower electrode, wherein:
  a bias power is applied to the lower electrode;
  a source power density is applied to said doped silicon dioxide layer and to at least one of said undoped silicon dioxide layer in an amount less than or equal to about 1000 W per 200-mm diameter wafer surface;
  the bias power is in a range from about 200 Watts less than said source power density to about 200 Watts greater than said source power density;
  doped silicon dioxide is selectively removed from said doped silicon dioxide layer to form a contact opening extending to said contact surface;
  said doped silicon dioxide is removed at a material removal rate that is at least 10 times greater than the material removal rates for each of:
    undoped silicon dioxide from said undoped silicon dioxide layer;
    said spacer material from said spacer; and
    said semiconductive material from said semiconductor substrate.

42. A process as recited in claim 41, wherein said gate stack comprises:
  said undoped silicon dioxide layer as a top layer thereof,
  a refractory metal silicide layer;
  a polysilicon layer; and
  a gate oxide layer as a bottom layer thereof.

43. A process as recited in claim 41, wherein the spacer material is comprises silicon nitride.

44. A process as recited in claim 41, wherein the spacer material comprises undoped silicon dioxide.

45. A process as recited in claim 41, further comprising, after conducting said high density plasma etch, forming a contact plug that comprises a conductive material, said contact plug being formed between said pair of gate stacks and on said contact surface.

46. A process as recited in claim 41, further comprising, prior to conducting said high density plasma etch, forming a patterned photoresist layer over said doped silicon dioxide layer, wherein conducting said high density plasma etch comprises removing said doped silicon dioxide through said patterned photoresist layer.

47. A process as recited in claim 41 wherein said high density plasma etch conducted in said chamber of a high density plasma etcher has:
  an ion density of not less than about $10^9$ ions/cm$^3$;
  an upper electrode to which is applied a source power of less than about 1000 Watts; and
  an etch chemistry selected from the group consisting of $C_2F_6$, $CF_4$, $C_3F_8$, $C_4F_{10}$, $CH_2F_2$, $CHF_3$, $C_2HF_3$, and combinations thereof.

48. A process as recited in claim 41, wherein:
  said at least one conductive layer comprises a polysilicon layer formed over said gate oxide layer; and
  each said gate stack further comprises a refractory metal silicide layer formed over said conductive layer and under said undoped silicon dioxide layer.

49. A process as recited in claim 48, wherein providing said pair of gate stacks further comprises selectively removing portions of said undoped silicon dioxide layer, said refractory metal silicide layer, said polysilicon layer, and said gate oxide layer.

50. A process for forming a gate structure, said process comprising:
  providing a multilayer structure over a semiconductor substrate;
  depositing an undoped silicon dioxide layer over said multilayer structure using a precursor having a gaseous silane, hydrogen, and oxygen flow;
  forming a patterned first photoresist layer over said undoped silicon dioxide layer, said patterned first photoresist layer having a first selected pattern;
  etching said undoped silicon dioxide layer and said multilayer structure through said first selected pattern to expose a contact surface on said semiconductor substrate;
  removing said first photoresist layer;
  depositing a layer of a nonconductive material over both of said undoped silicon dioxide layer and said contact surface;
  etching said layer of said nonconductive material to form a spacer over a lateral side of said undoped silicon dioxide layer and over a lateral side of said multilayer structure, said spacer being generally perpendicular to said semiconductor substrate;
  depositing a doped silicon dioxide layer over both of said multilayer structure and said undoped silicon dioxide layer;
  forming a patterned second photoresist layer over said doped silicon dioxide layer, said patterned second photoresist layer having a second selected pattern;
  conducting a high density plasma etch, wherein:
    said high density plasma etch is conducted in a high density plasma etcher having a lower electrode to which a bias power is applied;
    a source power density is applied to said doped silicon dioxide layer and to said undoped silicon dioxide layer in an amount less than or equal to about 1000 W per 200-mm diameter wafer surface; the bias power is in a range from about 200 Watts less than said source power density to about 200 Watts greater than said source power density;
    doped silicon dioxide is selectively removed from said doped silicon dioxide layer through said second selected pattern to expose said contact surface;
    said doped silicon dioxide is removed at a material removal rate that is at least 10 times greater than:
      the material removal rates for each of:
        undoped silicon dioxide from said undoped silicon dioxide layer;
        nonconductive material from said spacer;
        semiconductive material from said semiconductor substrate; and
        photoresist material from photoresist layer;
  removing said second photoresist layer; and
  forming a contact plug that comprises a conductive material in contact with said contact surface.

51. A process as recited in claim 50, wherein said nonconductive material is one of silicon nitride and undoped silicon dioxide.

52. A process as recited in claim 50, wherein conducting said high density plasma etch comprises using a fluorinated chemical etchant selected from the group consisting of $C_2F_6$, $CF_4$, $C_3F_8$, $C_4F_{10}$, $CH_2F_2$, $CHF_3$, $C_2HF_5$, $CH_3F$, and combinations thereof.

53. A process for forming a gate structure, comprising:
providing a multilayer structure over a semiconductor substrate, said multilayer structure comprising successive layers of gate oxide, polysilicon, and refractory metal silicide;
depositing an undoped silicon dioxide layer over said multilayer structure using a precursor having a gaseous silane, hydrogen, and oxygen flow;
forming a patterned first photoresist layer over said undoped silicon dioxide layer, the patterned first photoresist layer having a first selected pattern;
etching said undoped silicon dioxide layer and said multilayer structure through said first selected pattern to expose a contact surface on said semiconductor substrate;
removing said first photoresist layer;
forming a layer of a nonconductive material over both of said undoped silicon dioxide layer and said contact surface;
etching said layer of said nonconductive material to form a spacer over a lateral side of said undoped silicon dioxide layer and over a lateral side of said multilayer structure, said spacer being generally perpendicular to said semiconductor substrate;
forming a doped silicon dioxide layer over said multilayer structure and over said contact surface;
forming a patterned second photoresist layer over said doped silicon dioxide layer, said patterned second photoresist layer having a second selected pattern;
conducting a high density plasma etch wherein:
said high density plasma etch is conducted in a high density plasma etcher having a lower electrode to which a bias power is applied;
a source power density is applied to said doped silicon dioxide layer and to said undoped silicon dioxide layer in an amount less than or equal to about 1000 W per 200-mm diameter wafer surface;
the bias power is in a range from about 200 Watts less than said source power density to about 200 Watts greater than said source power density;
doped silicon dioxide is selectively removed from said doped silicon dioxide layer through said second selected pattern to expose said contact surface;
said doped silicon dioxide is removed at a material removal rate that is at least 10 times greater than: the material removal rate for each of:
undoped silicon dioxide from said undoped silicon dioxide layer;
nonconductive material from said spacer;
semiconductive material from said semiconductor substrate; and
photoresist material from said second photoresist layer;
removing said second photoresist layer; and
forming a contact plug comprising a conductive material in contact with said contact surface.

54. A process as recited in claim 53, wherein conducting said high density plasma etch comprises using a fluorinated chemical etchant selected from the group consisting of $C_2F_6$, $CF_4$, $C_3F_8$, $C_4F_{10}$, $CH_2F_2$, $CHF_3$, $C_2HF_5$, $CH_3F$, and combinations thereof.

55. A process as recited in claim 53, wherein said nonconductive material is one of silicon nitride and undoped silicon dioxide.

56. A method of forming a self-aligned contact opening, said method comprising:
providing a pair of gate stacks in spaced relation to one another on a semiconductor substrate, each of said gate stacks being covered by an undoped silicon dioxide layer;
forming a spacer adjacent to each of said gate stacks;
forming a doped silicon dioxide layer over said pair of gate stacks and over said semiconductor substrate;
forming a patterned photoresist layer over said doped silicon dioxide layer; and
conducting a high density plasma etch in a high density plasma etcher having a lower electrode, wherein:
a bias power is applied to the lower electrode;
a source power density is applied to said doped silicon dioxide layer and to at least one said undoped silicon dioxide layer in an amount less than or equal to about 1000 W per 200-mm diameter wafer surface;
the bias power is in a range from about 200 Watts less than said source power density to about 200 Watts greater than said source power density;
doped silicon dioxide is selectively removed from said doped silicon dioxide layer between said pair of gate stacks and through said pattern to form a self-aligned contact opening extending to said contact surface;
doped silicon dioxide is removed at a substantially greater material removal rate than that of undoped silicon dioxide from said undoped silicon dioxide layer; and
said undoped silicon layer resists said high density plasma etch.

57. A method as recited in claim 56, wherein said material removal rate of doped silicon dioxide is at least 10 times greater than the following material removal rates: the removal rate of undoped silicon dioxide from said undoped silicon dioxide layer, and the removal rate of semiconductive material from said semiconductor substrate.

* * * * *

UNITED STATES PATENT AND TRADEMARK OFFICE
CERTIFICATE OF CORRECTION

PATENT NO. : 6,444,586 B2
DATED : September 3, 2002
INVENTOR(S) : Kei-Yu Ko

It is certified that error appears in the above-identified patent and that said Letters Patent is hereby corrected as shown below:

Title page,
Item [56], References Cited, U.S. PATENT DOCUMENTS, change patent number "5,084,417" to -- 5,074,417 --

Column 3,
Line 7, after "referred" change "as to" to -- to as --
Line 8, after "The etch under these" change "condition" to -- conditions --

Column 8,
Line 15, after "such" change "a contact" to -- as a contact --

Column 9,
Line 63, after "dioxide" change "is" to -- that is --

Column 14,
Line 15, after "interleaving layer" change "is comprises" to -- comprises --
Lines 59-60, after "second layer" change "being comprising" to -- comprising --

Column 15,
Line 59, after "silicon dioxide-containing" insert -- layer --

Column 16,
Line 43, after "conducting" insert -- said high density plasma etch, forming --
Line 44, after "wherein" change "conduction" to -- conducting --

UNITED STATES PATENT AND TRADEMARK OFFICE
CERTIFICATE OF CORRECTION

PATENT NO. : 6,444,586 B2
DATED : September 3, 2002
INVENTOR(S) : Kei-Yu Ko

It is certified that error appears in the above-identified patent and that said Letters Patent is hereby corrected as shown below:

Column 17,
Line 45, after "material" change "is comprises" to -- comprises --

Signed and Sealed this

Twentieth Day of May, 2003

JAMES E. ROGAN
*Director of the United States Patent and Trademark Office*